United States Patent
Sasaki et al.

(10) Patent No.: US 8,952,576 B2
(45) Date of Patent: Feb. 10, 2015

(54) SEMICONDUCTOR DEVICE

(75) Inventors: Daisuke Sasaki, Fujisawa (JP);
Masatoshi Hasegawa, Hachioji (JP);
Masahiko Nishiyama, Fujisawa (JP);
Testuya Fukuoka, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 594 days.

(21) Appl. No.: 13/349,636

(22) Filed: Jan. 13, 2012

(65) Prior Publication Data
US 2012/0206187 A1    Aug. 16, 2012

(30) Foreign Application Priority Data
Feb. 15, 2011    (JP) .................. 2011-029280

(51) Int. Cl.
*H03K 17/687*    (2006.01)
*H03K 19/00*    (2006.01)
*H03K 19/003*    (2006.01)

(52) U.S. Cl.
CPC .......... *H03K 19/0016* (2013.01); *H03K 17/687* (2013.01); *H03K 19/00361* (2013.01)
USPC .......................................... 307/115; 327/544

(58) Field of Classification Search
CPC ..................................................... H03K 17/687
USPC .......................................... 307/115; 327/544
See application file for complete search history.

(56) References Cited

U.S. PATENT DOCUMENTS 6,490,715 B1 *   12/2002   Moriwaki et al. ............ 716/108
RE43,623 E *   8/2012   Tsukamoto .................... 716/133

FOREIGN PATENT DOCUMENTS

JP    2007-258226 A    10/2007

* cited by examiner

*Primary Examiner* — Hal Kaplan
(74) *Attorney, Agent, or Firm* — Miles & Stockbridge P.C.

(57) ABSTRACT

A semiconductor device that makes isolation circuits unnecessary and that also resolves the problem of through-current flowing during power supply shutdown transitions and during power supply recovery and that even flows between the regions during power shutdown. A semiconductor device of the present invention including a first power supply line, and a second power supply line coupled to a first power supply line by way of a first switch, a macro cell containing a macro cell core coupled to the second power supply line, and a third power supply line coupled by way of a second switch to a first power supply line, and a circuit block coupled to the third power supply line and also coupled to at least either the macro cell core input or output; and the second power supply line is coupled to the third power supply line.

6 Claims, 9 Drawing Sheets

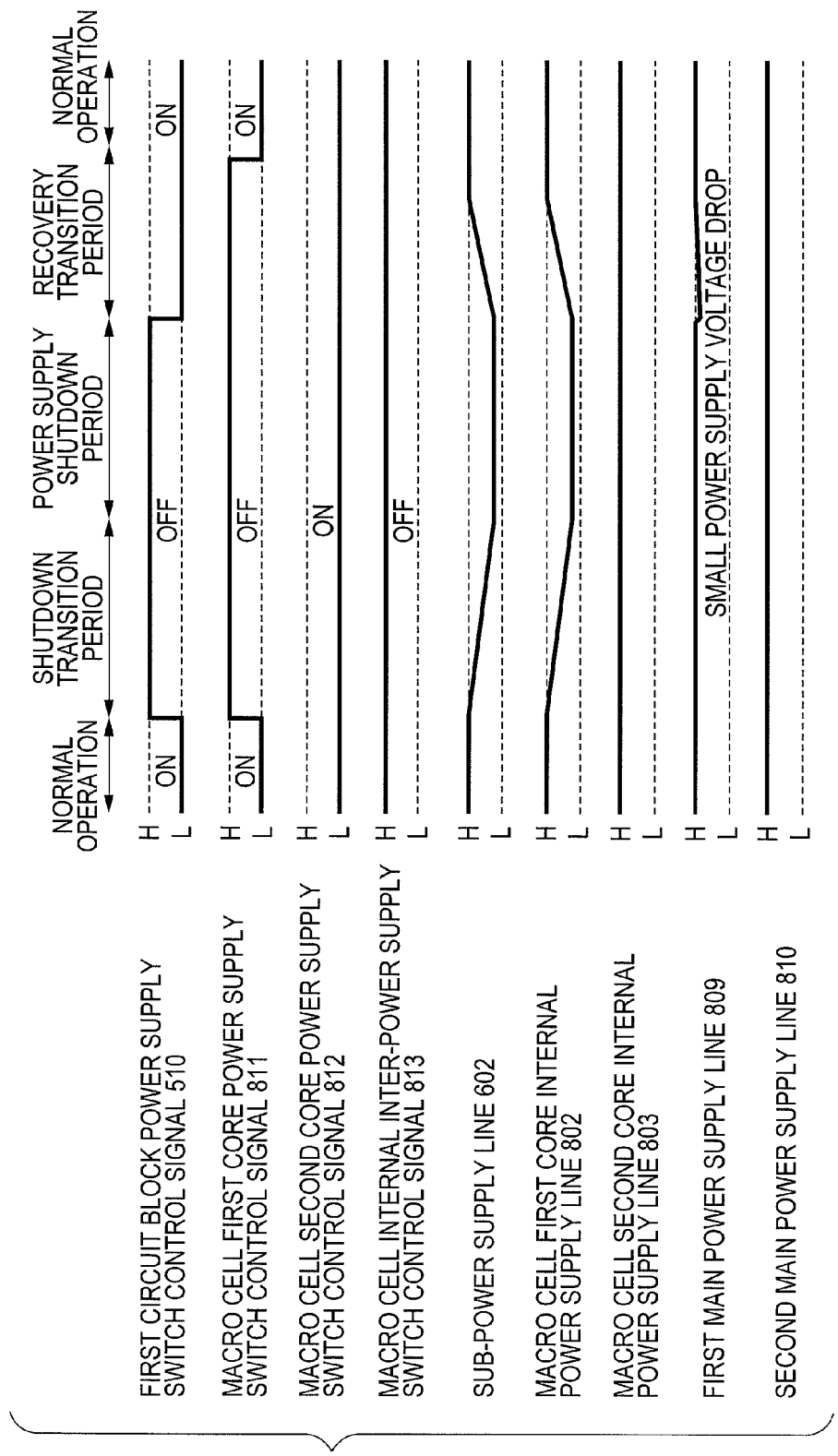

SEMICONDUCTOR DEVICE

CLAIM OF PRIORITY

The present application claims priority from Japanese patent application JP 2011-029280 filed on Feb. 15, 2011, the content of which is hereby incorporated by reference into this application.

FIELD OF THE INVENTION

The present invention relates to a semiconductor device, and relates in particular to a semiconductor device including an internal power shutdown scheme.

BACKGROUND OF THE INVENTION

Technology is already known in the art for saving energy by providing a power supply switch between the main power supply line and the circuit block included in macro cells, to turnoff the power supply switch during standby mode where the applicable circuit block is not operating in order to reduce the leakage current during standby mode.

Japanese Unexamined Patent Application Publication No. 2007-258226 discloses technology that provides an undefined output preventer circuit in the RAM block output stage for preventing through-current from flowing in the circuit blocks coupled to the RAM block that shuts off the power supply due to a floating state in the RAM block output for power shutdown caused by shutting off the power. Circuits provided in the output stage for preventing through-current such as undefined output preventer circuits are called isolation circuits.

SUMMARY OF THE INVENTION

Isolation circuits such as the undefined output preventer circuit in the output stage of the RAM block disclosed in Japanese Unexamined Patent Application Publication No. 2007-258226 are generally known as needed to prevent the flow of through-current in different power shutdown regions. However, the present inventors perceived that the problem of through-current flow occurs not only between circuit blocks whose power is shut off and circuit blocks whose power is not shut off, but also between circuit blocks whose power is shut off, or in other words where through-current flow occurs between regions where power is shut off.

FIG. 3 is a circuit diagram of a circuit 300 containing a circuit block and a macro cell with power supply switch evaluated first in the present invention. The circuit 300 is comprised of a macro cell with power supply switch 301, and a first circuit block 302, and a power supply switch control circuit 303. The macro cell with power supply switch 301 contains a macro cell power switch 305 and macro cell core 304 including a RAM; and the macro cell power switch 305 is coupled to a main power supply line 306 and a macro cell internal power supply line 307. The power supply switch control circuit 303 supplies a power supply switch control signal 308 to the macro cell power supply switch 305.

The first circuit block 302 supplies an input signal to the macro cell with power supply switch 301 and receives an output signal from the macro cell with power supply switch 301. A sub-power supply line 309 serving as the power supply line to the first circuit block 302 is coupled by way of the first circuit block power supply switch 310 to the main power supply line 306. The power supply switch control circuit 303 supplies a power supply switch control signal 308 to the first circuit block power supply switch 310.

As shown above, a common power supply switch control signal 308 is input as an on-off control signal for both power switches to both the macro cell with power supply switch 301 and the first circuit block 302. So power shutoff is performed together and not separately.

FIG. 4 is a timing chart showing in the circuit 300 the transition from normal operation state to power shutoff state, and recovery operation from power shutoff state to normal operation state. During a transition to power shutoff state, the speed of the drops in power supply voltage on the sub-power supply line 309 supplying electrical power to the first circuit block 302 and on the macro cell internal power line 307 supplying electrical power to the macro cell core 304 depend on the size of the leak current in each circuit and so do not match each other.

Here, when there is a rapid drop in the power supply voltage for example in the macro cell internal power line 307, and assuming there is no isolation circuit 311, then an intermediate voltage potential is output from output terminal of the macro cell core 304 to the post-stage circuit cell 312 within the first circuit block 302 during the power-off transition period shown in FIG. 4. This state therefore causes a through-current to flow to the first circuit block 302 and possibly cause unwanted noise in the power supply. This type of noise might for example spread via the power supply line (VSS) on the ground side and exert adverse effects on other power supply regions during their normal operation.

When the circuit 300 is recovering from power supply shutoff state to normal operation state, the speed of the respective rise in power supply voltage on the sub-power supply line 309 and macro cell internal power supply line 307 do not match each other because the drive power of the macro cell power supply switch 305 and first circuit block power supply switch 310 are different, and the internal circuit load capacitance of the macro cell with power supply switch 301 and the first circuit block 302 are different. When the rise in power supply voltage is faster for example in the macro cell internal power supply line 307, and assuming there is no isolation circuit 313, then an intermediate voltage potential is input from the pre-stage circuit cell 314 in the first circuit block 302, to the input terminal of the macro cell core 304 of the macro cell with power supply switch 301 and a through-current flows, during the recovery transition period shown in FIG. 4. This through-current causes an increase in power consumption in the circuit 300, or a (voltage) drop to occur in the main power supply line 306 during the recovery transition period; or delays the time until power supply voltage recovery in the macro cell with power supply switch 301 to a time longer than intended in the circuit design, and in some cases may cause the semiconductor device containing the circuit 300 to malfunction.

Due to the above reasons, the isolation circuits 311 and 313 were provided for cases where the macro cell with power supply switch 301 and the power supply switch of the first circuit block 302 are operating together. However, adding these isolation circuits 311 and 313 causes the problem of a drop in cell operating speed due to the increased cell delay in the macro cell 301 and also the problem of a larger cell surface area in the macro cell 301.

The present invention has the object of resolving the problem of through-current flow during power supply shutdown transitions and recovery operations that occur in cases where power is shutdown among regions or namely even in cases where power supply shutdown switches contained in the respective plural regions operate together. The present invention also renders isolation regions unnecessary.

To address the above problems, the semiconductor device of the present invention is comprised of a first power supply line, and a second power supply line coupled to a first power supply line by way of a first switch, a macro cell containing a macro cell core coupled to the second power supply line, and a third power supply line coupled by way of a second switch to a first power supply line, and a circuit block coupled to the third power supply line and also coupled to at least either the macro cell core input or output; and in which the second power supply line is coupled to the third power supply line.

The present invention is capable of preventing through-current flow without having to utilize an isolation circuit.

BRIEF DESCRIPTION OF THE DRAWINGS

FIG. 10 is one example of a timing chart corresponding to the circuit diagram in FIG. 8 during power shutdown only for the macro cell first core.

DETAILED DESCRIPTION OF THE PREFERRED EMBODIMENTS

First Embodiment

Figure 5:
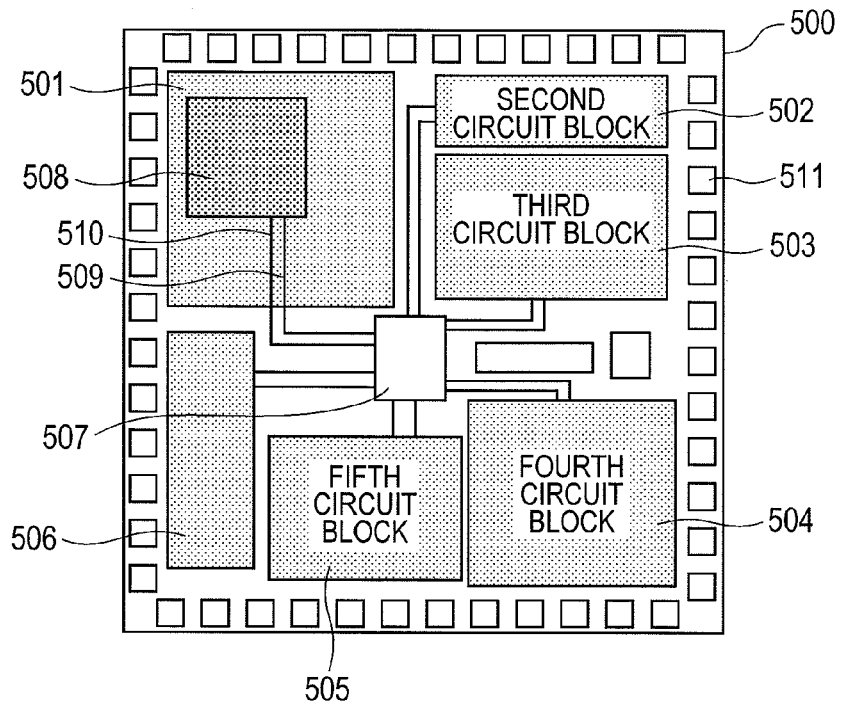
FIG. 5 is a drawing showing the layout of the embodiment of the semiconductor device of the present invention.

FIG. 5 is a drawing showing the layout of the semiconductor device 500 as the embodiment of the semiconductor device of the present invention. The semiconductor device 500 is comprised of a first circuit block 501, and a second circuit block 502, a third circuit block 503, a fourth circuit block 504, a fifth circuit block 505, a sixth circuit block 506, power supply switch control circuit 507, an input/output terminal (IO) 511, and a macro cell with power supply switch 508 configured enclosed by a first circuit block 501. The macro cell with power supply switch 508 is the RAM macro cell with power supply switch of the present embodiment. Among the first circuit block 501 and the second through sixth circuit block 502 through 506, at least the first circuit block 501 includes a power supply switch, capable of electrical power-saving in the semiconductor device 500 by turning the power supply switches on each circuit block on and off. In the first circuit block, a macro cell power supply switch control signal 509 and a circuit block power supply switch control signal 510 branch off from the power supply switch control circuit 507. The respective macro cell power supply switch control signals and the respective circuit block power supply switch control signals branch off from the power supply switch control circuit 507 in the second through the sixth circuit blocks 502 through 506 the same as the first circuit block 501. During standby mode, the respective power supply switch control signals in each circuit block turn off the power supply switch and shut off the supply of electrical charges from the main power supply line to allow reducing power consumption in the semiconductor device 500.

Figure 6:
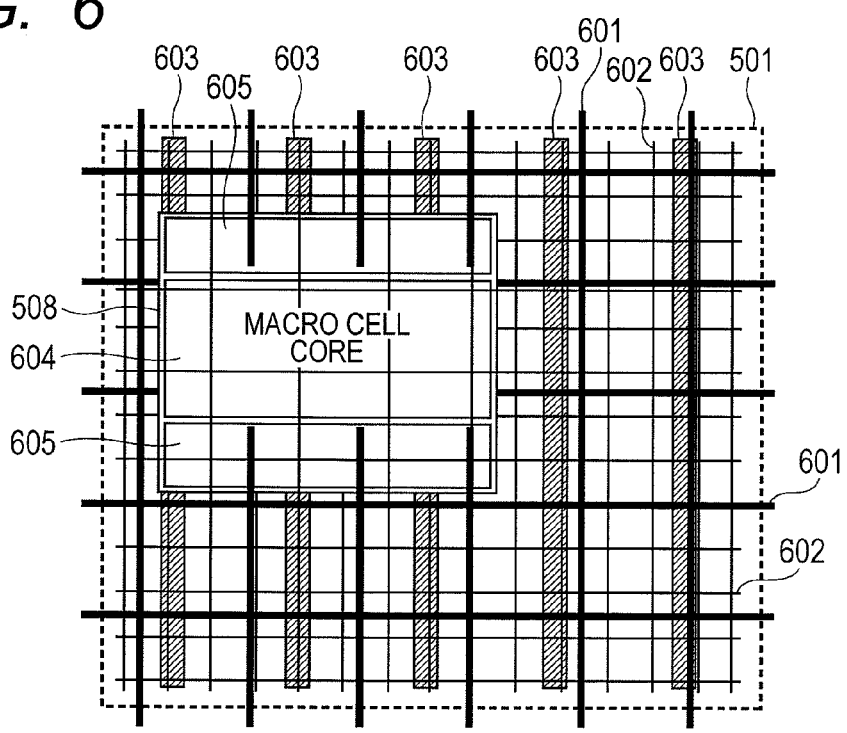
FIG. 6 is a drawing showing one example of the detailed layout of the macro cell with power supply switch and the first circuit block in FIG. 5.
Figure 7:
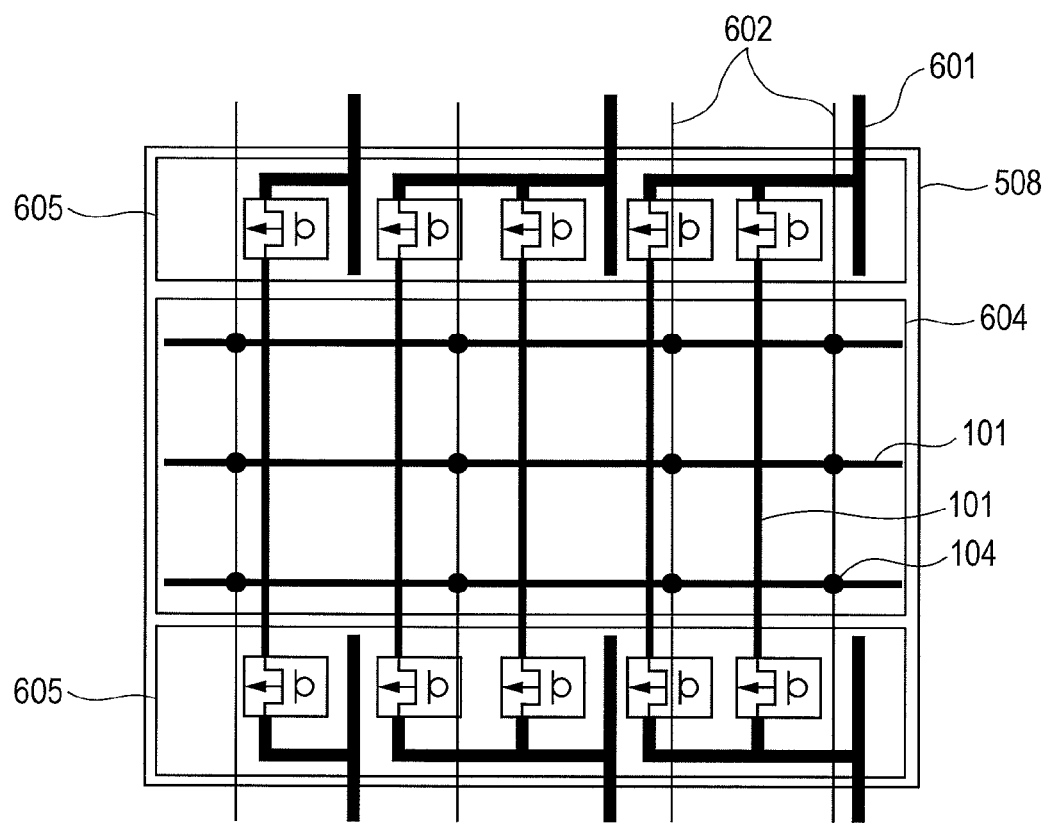
FIG. 7 is a drawing showing one example of the detailed layout of the macro cell with power supply switch in FIG. 6.

FIG. 6 is a drawing showing one example of the detailed layout of the first circuit block 501. FIG. 7 is a drawing showing one example of the detailed layout of the macro cell with power supply switch 508 in FIG. 6. The first circuit block 501 contains a main power supply line 601, a sub-power supply line 602, and a first circuit block power supply switch 603 that couples to these lines, and a macro cell with power supply switch 508 is physically provided in a shape embedded within the first circuit block 501. The macro cell with power supply switch 508 internally contains a macro cell power supply switch 605 and a macro cell core 604 including a RAM. The macro cell power supply switch 605 couples an internal power supply line 101 contained in the macro cell 508 including a RAM, to a main power supply line 601 retained in the region of the macro cell power supply switch of macro cell 508. The main power supply line 601, the sub-power supply line 602, and the internal power supply line 101 are each arranged in a matrix shape as shown in FIG. 6 and FIG. 7.

If there is a high-speed, high-performance RAM mounted that requires a large quantity of electrical power then a power supply drop might occur in the internal power supply line 101 during RAM operation. The drive power of the macro cell power supply switch 605 is therefore increased to a larger relative value than the first circuit block power supply switch 603. The larger drive power in this way serves to lower the power supply impedance during normal operation so that the problem of a power supply drop in the macro cell core 604 including the RAM can be avoided. By supplying power as described above on the main power supply line 601 up to the macro cell power supply switch 605 and not only from the regularly arranged first circuit block power supply switches 603, an ample amount of electrical power can be supplied to the macro cell core 604.

The sub-power supply line 602 is laid out along the inside of the macro cell core 64 as shown in FIG. 7, and a coupling section 104 is formed at a cross point of the sub-power supply line 602 and the macro-cell internal power supply line 101 to couple the sub-power supply line 602 and the macro cell internal power supply line 101. This coupling section 104 in this embodiment is a via (through-hole) coupling structure that couples the macro-cell internal power supply line 101 and the sub-power supply line 602 at their cross point. Other than the via coupling structure, the coupling section 104 can also be achieved by forming wiring to implement a separate connection, however utilizing the via coupling of the present embodiment as the coupling method allows suppressing the number of power supply lines so that the number of signal wires for use can be increased by an equivalent amount and lead to a smaller chip surface area in cases where the chip surface area is mostly determined by the wiring surface area. This coupling section 104 also allows suppressing the difference in voltage potential between the macro cell internal power supply line 101 supplying electrical power to the macro cell core 604, and the sub-power supply line 602 supplying electrical power to the first circuit block 501.

During normal operation, the power supply impedance drops because the first circuit block power supply switch 603 and the macro cell power supply switch 605 turn on so that even a comparatively high-resistance in the coupling section 104 that couples the macro cell internal power supply line 101 and the sub-power supply line 602 is not a problem. The number of coupling sections 104 can therefore be reduced. On the other hand, if for example the coupling of the macro cell internal power supply line 101 and the sub-power supply line 602 is achieved through joint use of the load capacity of each of these power supply nodes, then the number of coupling sections 104 can be increased to the required quantity at times where for example wanting to improve the capability to withstand power supply noise.

Figure 1:
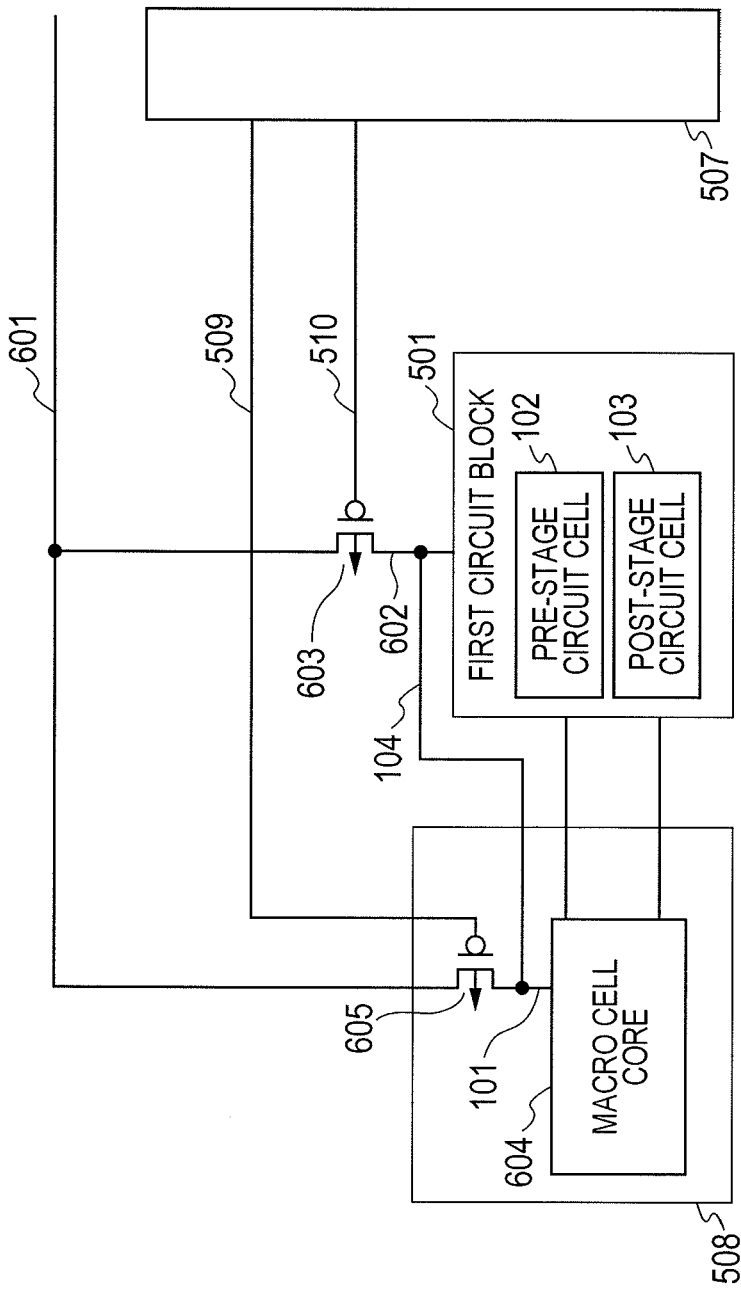
FIG. 1 is a circuit diagram of the circuit block and macro cell with power supply switch in the embodiment of the present invention.

FIG. 1 is a circuit diagram showing the coupling relation between the macro cell with power supply switch 508 and the first circuit block 501, and the power supply switch control circuit 507. The macro cell with power supply switch 508 internally contains a macro cell core 604 including the RAM, a macro cell power supply switch 605, and a macro cell internal power supply line 101. The main power supply line 601 for supplying electrical power from the semiconductor device 500, and the macro cell internal power supply line 101 are coupled together by way of the macro cell power supply switch 605. The macro cell core 604 including the RAM is coupled to the macro cell internal power supply line 101 and is supplied with electrical power from the macro cell internal power supply line 101. The power supply switch control circuit 507 supplies a macro cell power supply switch control signal 509 to the macro cell power supply switch 605. Providing the macro cell power supply switch 605 within the macro cell with power supply switch 508, allows placing the main power supply line 601 to extend within the macro cell 508, and allows supplying electrical power at low impedance to the macro cell core 604 including the RAM.

The first circuit block 501 contains a pre-stage circuit cell 102 for sending signals to the macro core 604 within the macro cell 508, and a post-stage circuit cell 103 for receiving signals from the macro cell core 604. In other words, the input and output of the macro cell 508 are coupled to the first circuit block 501. In this embodiment, there is an input and output of signals between the macro cell core 604 including the RAM and the first circuit block 501; however, the coupling with the first circuit block 501 serving as a peripheral circuit may sometimes be accomplished by just the input or output from the macro cell core 604 depending on a function contained in the macro cell core 604.

A sub-power supply line 602 is coupled to the first circuit block 501, and electrical power is supplied to the first circuit block 501 from the sub-power supply line 602. The sub-power supply line 602 is coupled by way of the first circuit block power supply switch 603 to the main power supply line 601. The power supply switch control circuit 507 supplies a first circuit block power supply switch control signal 510 to the first circuit block power supply switch 603. In this embodiment, the case where a PMOS is utilized for the power supply switches 603 and 605 is shown in the figure; however the present invention is applicable in the same way in the case where using NMOS as the power supply switches, or when using both PMOS and NMOS switches.

The macro cell internal power supply line 101 and the sub-power supply line 602 moreover are coupled by the coupling section 104. The coupling implemented by this coupling section 104 acts to suppress the difference in voltage potential between the macro cell internal power supply line 101 for supplying electrical power to the macro cell core 604 and the sub-power supply line 602 for supplying electrical power to the first circuit block 501 so that the input of an intermediate voltage potential to the input/output terminal of the first circuit block 501 and the macro cell core 604 can be prevented, and therefore the flow of through-current is prevented in cases where transitioning to a power shutdown state or recovering from a power shutdown state in the first circuit block 501 and the macro cell 508, even if there is no isolation circuit between the first circuit block 501 and the macro cell core 604. Therefore no isolation circuit is needed so the cell delay and the cell surface area within the macro cell 508 can be kept small.

Figure 2:
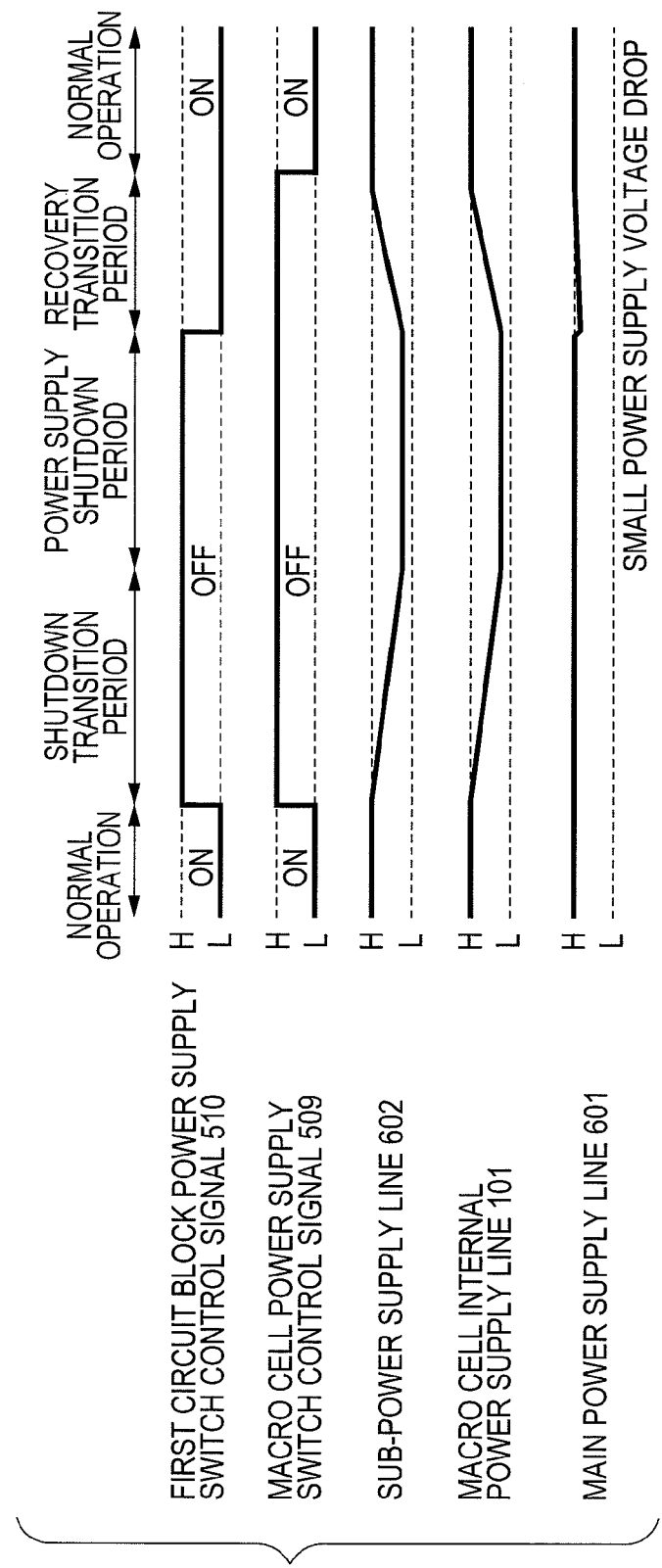
FIG. 2 is one example of a timing chart for the circuit diagram in FIG. 1.
Figure 3:
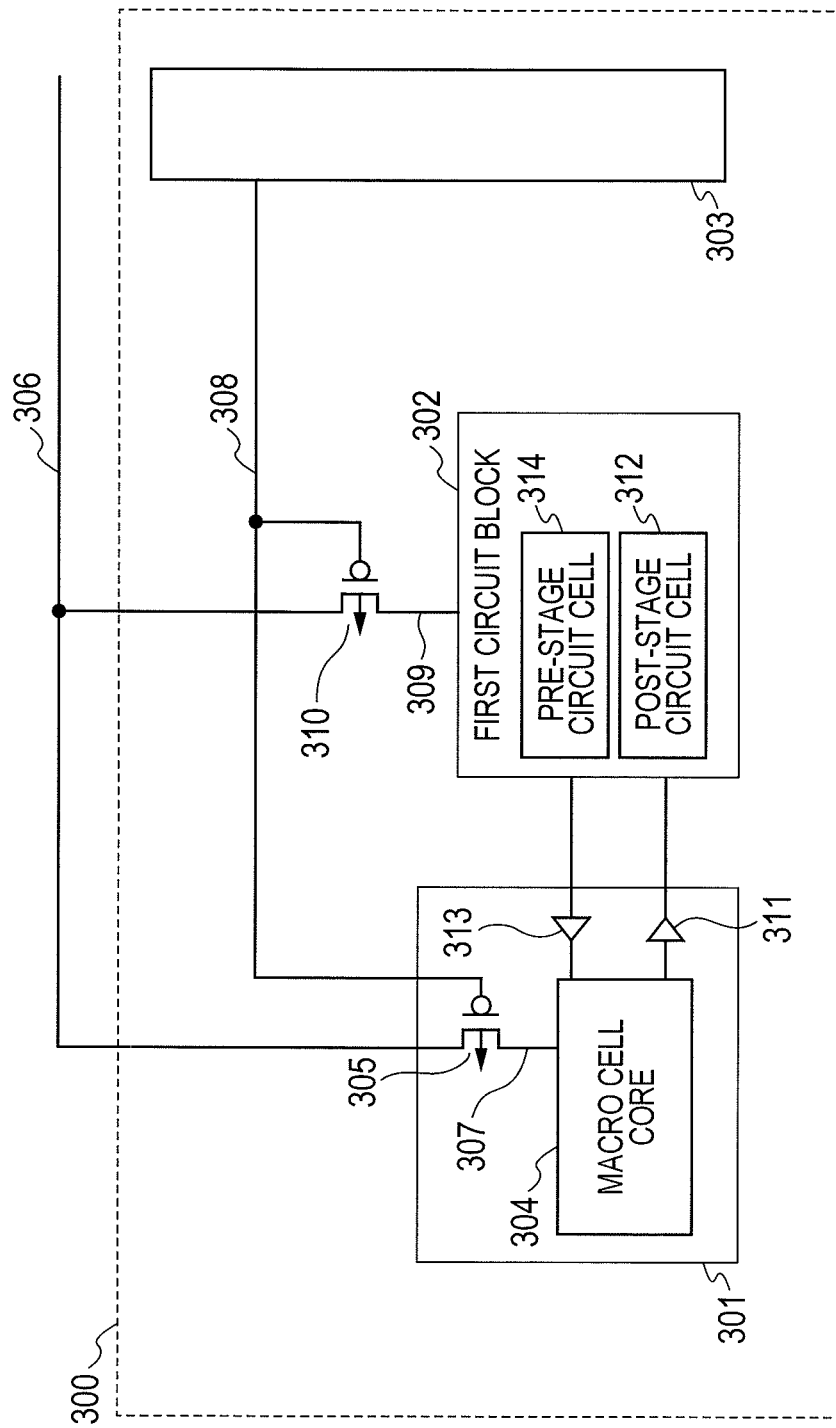
FIG. 3 is a circuit diagram of the circuit under review in the present invention by the present inventors.

FIG. 2 is a timing chart corresponding to the circuit shown in FIG. 1. When transitioning from the normal operating state to the power supply shutdown state, the first circuit block power supply switch control signal 510 and the macro cell power supply switch control signal 509 set the power supply switches 603 and 605 to the off state. Setting these power supply switches 603 and 605 to the off state therefore causes a voltage drop to occur in the sub-power supply line 602 and the macro cell internal power supply line 101 due to leak current.

Figure 4:
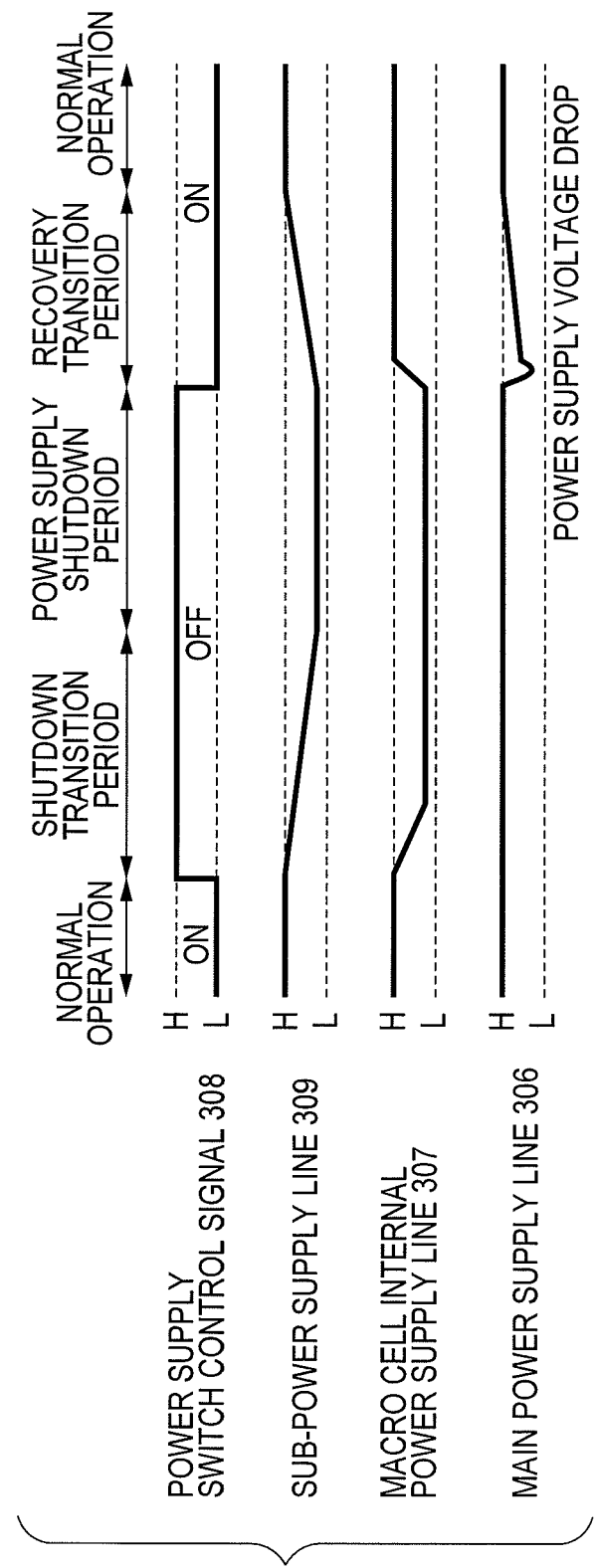
FIG. 4 is one example of a timing chart corresponding to the circuit diagram in FIG. 3.

At this time, assuming there is no coupling section 104, a difference in power supply voltage drop speeds occurs between the macro cell internal power supply line 101 and the sub-power supply line 602 as already described using FIG. 4, so that a difference in the voltage potential on both power supply lines occurs. This reason is that the RAM leakage current is comparatively large compared to the leak current from other circuit section so that the leak current in the macro cell core 604 is relatively large compared to the leak current in the first circuit block 501 thus causing a difference in voltage potential. The present embodiment utilizes a macro cell core 604 including a RAM but the problem of different power supply voltage drop speeds is not a problem limited only to the RAM contained in the macro cell core 604. In the case for example of a macro cell core 604 that utilizes transistors having a low threshold voltage compared to the first circuit block 501 for high speed operation, the lower the threshold voltage in the transistors, the larger the leak current so that when transitioning from a normal operation state to a power shut-off state, the power supply voltage in the macro cell internal power supply line 101 will drop quickly compared to the power supply voltage in the sub-power supply line 602.

Due to the above reasons, and assuming there is no coupling section 104, during the transition period from the normal operation state to the power shutdown state, the macro cell core 604 might possibly input an intermediate voltage potential into the post-stage circuit cell 103 within the first circuit block 501. When the post-stage circuit cell 103 for example is an inverter circuit, then a sudden through-current might flow due to setting both the NMOS and PMOS within the inverter circuits on, so that the transition time to the power shutdown state become a time different than intended in the circuit design, and power supply noise might possibly occur. A semiconductor device containing a circuit as shown in FIG. 1 might therefore malfunction.

In contrast to the above operation, in the semiconductor device 500 of the present embodiment, the coupling implemented by the coupling section 104 can suppress the difference in voltage drop speeds between the macro cell internal power supply line 101 and the sub-power supply line 602. The input of an intermediate voltage potential to the input terminal of the post-stage circuit cell 103 within the first circuit block 501 can therefore be prevented, and consequently the flow of through-current can also be prevented.

When recovering from the power shutdown state, first of all, the first circuit block power supply switch control signal 510 only turns on the first circuit block power supply switch 603, and after the voltage in the sub-power supply line 602 and macro cell internal power supply line 101 have risen to a sufficiently high voltage, the macro cell power supply switch control signal 509 turns on the macro cell power supply switch 605 which lowers the power supply impedance, and causes a transition to a normal operation state.

When there is a voltage rise in the sub-power supply line 602 and the macro cell internal power supply line 101 caused by the respective power supply switches, and assuming there is no coupling section 104, then a difference in voltage potential on both of power supply lines will occur due to the difference in voltage rise speeds between the sub-power supply line 602 and the macro cell internal power supply line 101 as previously described in FIG. 4. When for example using a high-performance RAM macro cell that must operate at high-speed, and the number of PMOS switches in the macro cell power supply switch 605 for suppressing voltage drops during operation is relatively large compared to the first circuit block power supply switch 603, then the voltage in the macro cell internal power supply line 101 will rise comparatively fast compared to the sub-power supply line 602 during recovery from power shutoff state to the normal operation state. The pre-stage circuit cell 102 within the first circuit block 501 might therefore possibly input an intermediate voltage potential into the macro cell core 604 including the RAM during this period where transitioning from the power shutoff state to the normal operating state. If for example the intermediate voltage potential input to the macro cell core including the RAM is received at the inverter circuit within the RAM, then both the NMOS and PMOS elements within the inverter circuit will turn on and possibly cause a through-current to flow. The effects of this through-current might be large in cases where there are multiple input terminals in the macro cell in particular for data write bit terminals on a RAM. This through-current may lead to the problems such as a large increase in the electrical power, a drop in the power supply voltage, and the difference between the (actual) time needed for the power supply voltage to recover and the intended time during circuit design. A semiconductor device containing a circuit as shown in FIG. 1 might therefore malfunction.

In contrast, in the semiconductor device 500 of the present embodiment, the coupling section 104 couples the macro cell internal power supply line 101 to the sub-power supply line 602 during the recovery transition period which suppresses a difference in voltage rise speeds in the macro cell internal power supply line 101 and sub-power supply line 602. The input of an intermediate voltage potential to the input terminal of the macro cell with power supply switch 508 is therefore prevented, and consequently the flow of through-current also prevented. Therefore, no isolation circuit is needed so the cell delay and the cell surface area within the macro cell 508 can be kept small. Moreover, the macro cell power supply switch 605 utilizes a higher drive power than the drive power in the first circuit block power supply switch 603, so that the charging of the macro cell 508 is only implemented by way of the first circuit block power supply switch 603 having the smaller drive power, while the macro cell power supply switch 605 is still in the off state, and so that power supply noise within the main power supply line 601 is also suppressed.

Here, the use of the term macro cell indicates hard macro cells such as in RAM, which are cells laid out and designed down to the transistor level in consideration of optimal performance, power and cell area, unlike small-scale basic cells such as for NAND gates or inverter gates such as those including ASIC user logic and random logic that are merely mounted in circuit blocks formed by automatic mounting by automated placement wiring tools. Moreover, these cells also have an optimal placement of power supply switches provided so as to render the cells capable of meeting power supply voltage drop requirements and also allow satisfying cell performance in view of internal cell power consumption. These are further guaranteed to be durable enough to withstand power supply drops in the cell itself. These types of macro cells are also set to library specifications as one circuit cell so that the design data can be reutilized in another semiconductor device or another circuit block, etc.

The first circuit block 501 and the macro cell 605 can together be set to library specifications as one circuit cell to allow reutilizing the design data in order to make circuit design of the semiconductor device easier.

As described above, besides coupling the main power supply line 601 with the macro cell power supply switch 605, there is also a coupling between the sub-power supply line 602 and the macro cell internal power supply line 101 in the macro cell 508 of the present embodiment. Usually, a power supply terminal is defined in the cell library to allow automatic power supply wiring coupling by automated wiring tools, etc. Besides the power supply terminal of macro cell power supply switch 605 coupled to the main power supply line 601 in the library of macro cell 508, the power supply terminal for the macro cell internal power supply line 101 for coupling the sub-power supply line 602 is also defined in another library so that couplings can be made by automatic power supply wiring by automated wiring tools and so on to make designing the semiconductor device easier.

Second Embodiment

Figure 8:
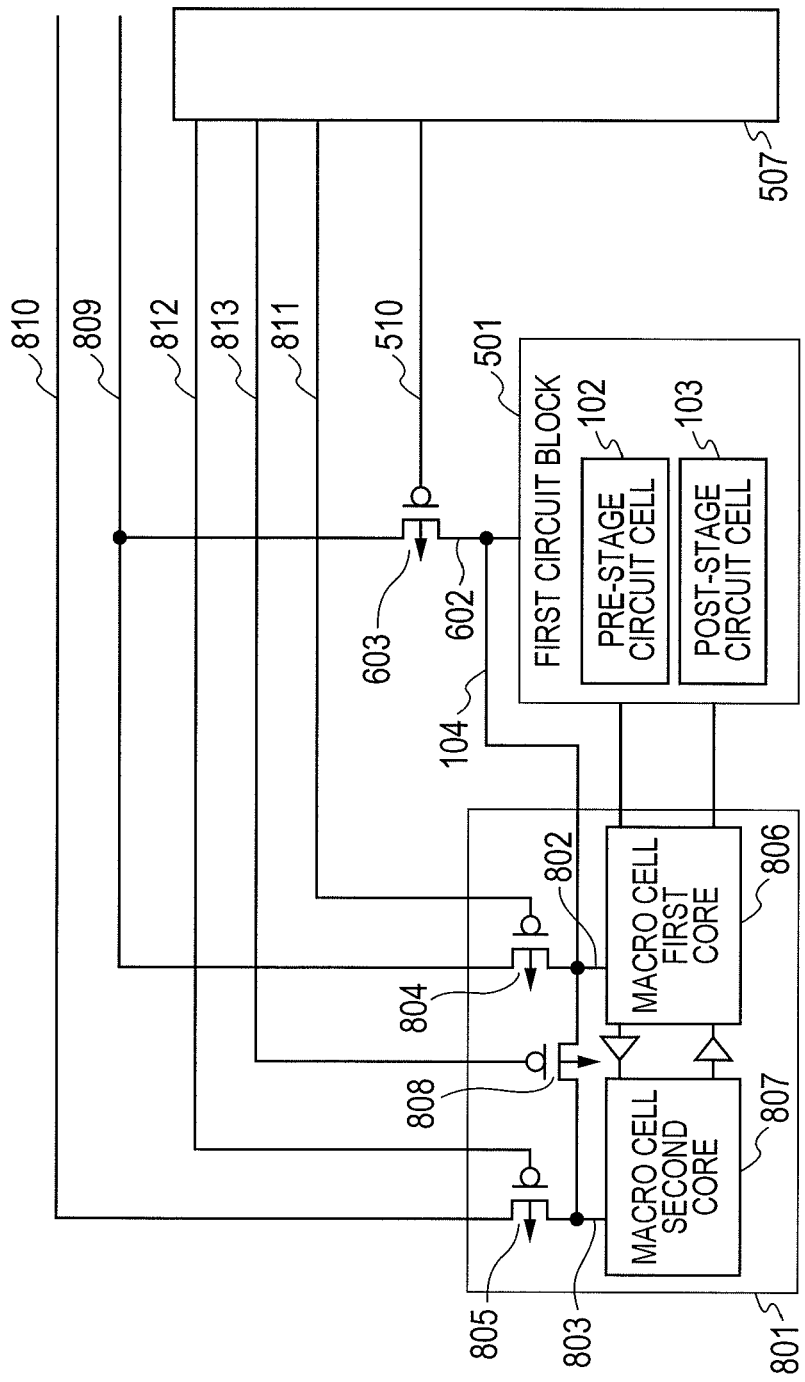
FIG. 8 is a circuit diagram of the circuit block and macro cell with power supply switch in the embodiment of the present invention.

FIG. 8 is a circuit diagram showing the connection relations between the power supply switch control circuit 507 and the first circuit block 501 and the macro cell with power supply switch 801 containing plural power supply region types as one example of the embodiment when the macro cell with power supply switch is comprised of plural types of power supply regions. The macro cell with power supply switch 801 is comprised of a macro cell first core 806 including memory peripheral circuit sections such as RAM macro decoders and sensing amplifiers in its interior, a macro cell second core 807 containing a memory array section of RAM macros, a macro cell first core power supply switch 804, a macro cell first core internal power supply line 802, a macro cell second core power supply switch 805, and a macro cell second core internal power supply line 803.

The first main power supply line 809 and macro cell first core internal power supply line 802 are coupled by way of the macro cell first core power supply switch 804. The second main power supply line 810 and the macro cell second core internal power supply line 803 are coupled by way of a macro cell second core power supply switch 805. The macro cell first core 806 including RAM memory peripheral circuit sections is coupled to the macro cell first core internal power supply line 802, and is supplied with electrical power from the macro cell first core internal power supply line 802. The macro cell second core 807 containing a RAM memory array section is coupled to the macro cell second core internal power supply line 803, and is supplied with electrical power from the macro cell second core internal power supply line 803.

The power supply switch control circuit 507 supplies a macro cell first core power supply switch control signal 811 to the macro cell first core power supply switch 804. The power supply switch control circuit 507 supplies a macro cell second core power supply switch control signal 812 to the macro cell second core power supply switch 805. Each of the first main power supply line 809 and second main power supply line 810 can be brought within the macro cell 801 by providing the macro cell first core power supply switch 804 and the macro cell second core power supply switch 805 within the macro cell with power switch 801, so that electrical power can be supplied at a low impedance to the macro cell first core 806 containing RAM peripheral circuits, and the macro cell second core 807 containing a RAM, memory array section.

In this embodiment, the power shutoff states in the first circuit block 501 and the macro cell first core 806 containing RAM memory peripheral circuit sections are operated together. However, the power shutoff states in the macro cell first core 806 containing RAM memory peripheral circuit sections and the macro cell second core 807 containing a RAM memory array section need not always be operated together, and can be independently controlled by the macro cell first core power supply switch control signal 811, and the macro cell second core power supply switch signal 812. The macro cell first core 806 containing RAM memory peripheral circuit sections can be set to the power shutoff state, and the macro cell second core 807 containing a RAM memory array section can be set to just the normal operating state. The macro cell first core internal power supply line 802 and the macro cell second core internal power supply line 803 are coupled by the macro cell internal inter-power supply switch 808.

The first circuit block 501 is comprised of a pre-stage circuit cell 102 for sending signals to the macro cell first core 806 of the macro cell 801, and a post-stage circuit cell 103 for receiving signals from the macro cell first core 806. The input and output of the macro cell 801 are in other words coupled to the first circuit block 501. In this embodiment, there is an input and output of signals from the first circuit block 501 to the macro cell core 801 containing the RAM. However, in some cases only the inputs to or only outputs from the macro cell first core 806 are coupled by the first circuit block functioning as the peripheral circuit, depending on the functions contained by the macro cell first core 806.

A sub-power supply line 602 is coupled to the first circuit block 501, and electrical power is supplied to the first circuit block 501 from the sub-power supply line 602. The sub-power supply line 602 is coupled by way of the first circuit block power supply switch 603 to the first main power supply line 809. The power supply switch control circuit 507 supplies a first circuit block power supply switch control signal 510 to the first circuit block power supply switch 603. In this embodiment, the case where a PMOS is utilized for the power supply switches 603, 804 and 805 is shown in the figure. However, the present invention is applicable in the same way in the case where using NMOS as the power supply switches, or when using both PMOS and NMOS switches.

The macro cell first core internal power supply line 802 and the sub-power supply line 602 moreover are coupled by the coupling section 104. The coupling section 104 is a via (through-hole) coupling structure or wiring that is the same as the first embodiment. The coupling implemented by this coupling section 104 acts to suppress the difference in voltage potential between the macro cell first internal power supply line 802 that supplies electrical power to the macro cell first core 806, and the sub-power supply line 602 that supplies electrical power to the first circuit block 501 so that the input of an intermediate voltage potential to the input/output terminal of the first circuit block 501 and the macro cell first core 806 can be prevented, and therefore the flow of through-current can be prevented in cases where transitioning to a power shutdown state or recovering from a power shutdown state in the first circuit block 501 and the macro cell first core 806, even if there is no isolation circuit between the input/output coupling of the first circuit block 501 and the macro cell first core 806. The embodiment therefore requires no isolation circuit and so can keep the cell delay in the macro cell and the cell surface area to a small value.

Figure 9:
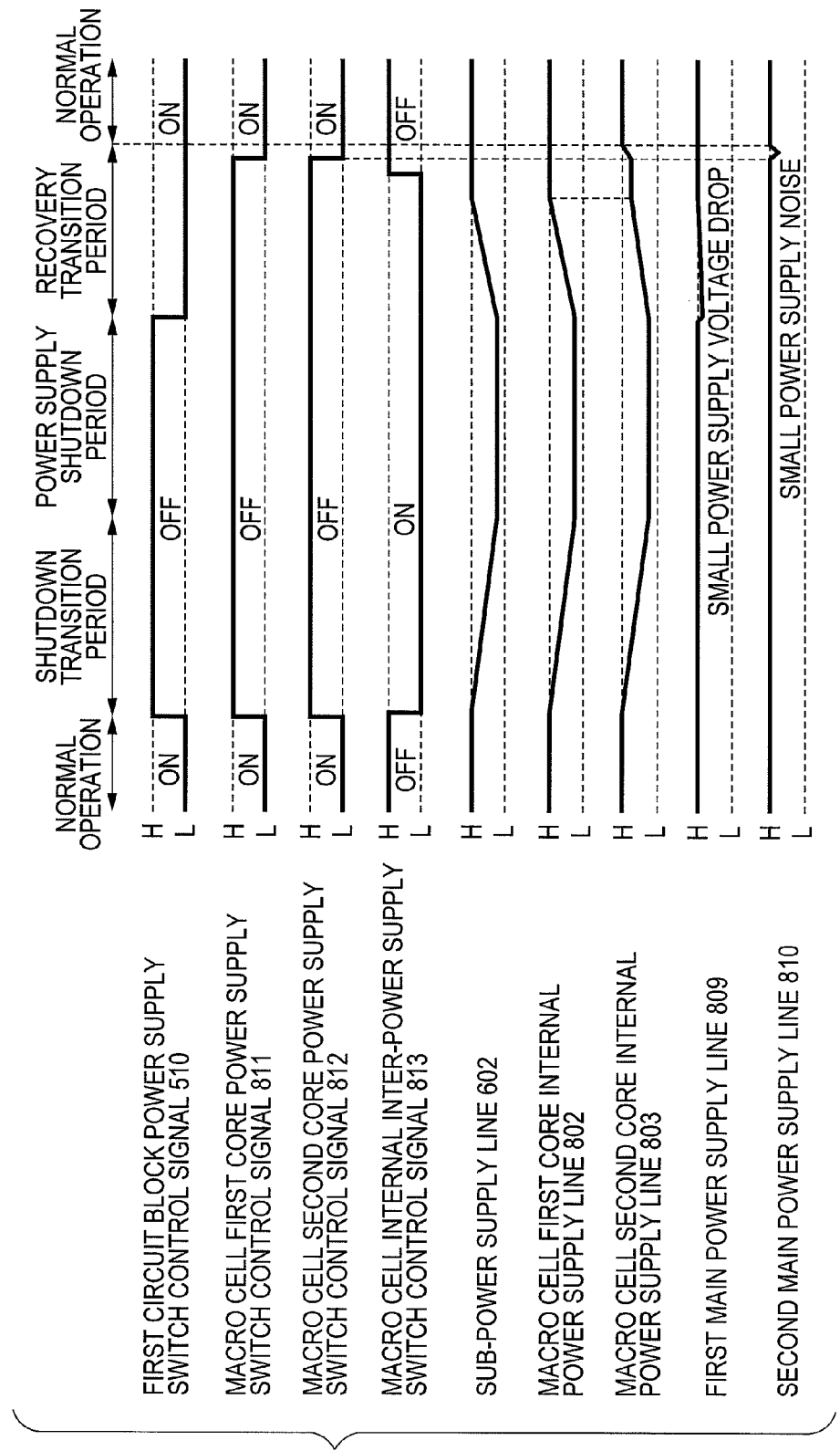
FIG. 9 is one example of a timing chart corresponding to the circuit diagram in FIG. 8 when the power to the macro cell is fully shut down.

FIG. 9 is one example of a timing chart corresponding to the circuit diagram shown in FIG. 8. This drawing shows the full shutdown mode operation for shutting down in both the macro cell first core 806 containing a RAM memory peripheral circuit section and the macro cell second core 807 containing a RAM memory array section.

When transitioning from the normal operating state to the power supply shutdown state, the first circuit block power supply switch control signal 510, the macro cell first core power supply switch control signal 811, and the macro cell second core power supply switch control signal 812, set the power supply switches 603, 804 and 805 to the off state; and the macro cell internal inter-power supply switch control signal 813 sets the macro cell internal inter-power supply switch 808 to the on state. A voltage drop therefore occurs in the sub-power supply line 602, the macro cell first core internal power supply line 802, and the macro cell second core internal power supply line 803 due to the leak current.

At this time, assuming there is no coupling section 104, a difference in power supply voltage drop speeds occurs between the macro cell first core internal power supply line 802 and the sub-power supply line 602 as already described using FIG. 4 so that a difference in the voltage potential occurs on both of these power supply lines. Due to the above reason, during the transition period from the normal operation state to the power shutdown state, the macro cell first core 806 might possibly input an intermediate voltage potential into the post-stage circuit cell 103 within the first circuit block 501. When the post-stage circuit cell 103 for example is an inverter circuit, then a through-current might suddenly flow due to setting both the NMOS and PMOS elements within the inverter circuit on, the transition time to the power shutdown state might become a time different than intended during the circuit design, and power supply noise might possibly occur. Therefore, a semiconductor device containing a circuit as shown in FIG. 8 might malfunction.

In contrast to the above, in the present embodiment, the coupling implemented by the coupling section 104 can suppress the difference in voltage drop speeds. The input of an intermediate voltage potential to the input terminal of the post-stage circuit cell 103 within the first circuit block can therefore be prevented, there is no need to add an isolation circuit, and the flow of through-current can also be prevented.

When recovering from the power shutdown state, first of all, the first circuit block power supply switch control signal 510 only turns on the first circuit block power supply switch 603, and after the voltage in the sub-power supply line 602, and macro cell first core internal power supply line 802, and macro cell second core internal power supply line 803 have risen to a sufficiently high voltage; the macro cell internal inter-power supply switch control signal 813 turns off the macro cell internal inter-power supply switch 808, and macro cell first core power supply switch control signal 811 and the macro cell second core power supply switch control signal 812 turn on the macro cell first core power supply switch 804 and the macro cell second core power supply switch 805, to lower the power supply impedance, and transition to a normal operation state.

When there is a voltage rise in the sub-power supply line 602 and the macro cell first core internal power supply line 802 caused by the respective power supply switches, and assuming there is no coupling section 104, then a difference in voltage potential will occur on both power supply lines due to the difference in voltage rise speeds between the sub-power supply line 602 and the macro cell first core internal power supply line 802 as previously described in FIG. 4. When for example in the case of using a high-performance RAM macro cell that requires high-speed operation, and the number of PMOS switches in the macro cell power supply switches 804 and 805 for suppressing power supply drops during operation is relatively large compared to the first circuit block power supply switch 603, then the voltage in the macro cell first core internal power supply line 802 will rise comparatively fast compared to the sub-power supply line 602 during the recovery period from power shutoff state to the normal operation state. The pre-stage circuit cell 102 within the first circuit block 501 might therefore possibly input an intermediate voltage potential into the macro cell first core 806 containing the RAM memory peripheral circuit sections during this period where transitioning from the power shutoff state to the normal operating state. If for example the intermediate voltage potential input to the macro cell core containing a RAM is received at the inverter circuit within the RAM, then both the NMOS and PMOS elements within the inverter circuit will turn on and possibly cause a through-current to flow. The effects of this through-current might be large in cases where there are multiple input terminals in the macro cell in particular for data write bit terminals on a RAM. This through-current may lead to problems such as a large increase in electrical power, a drop in the power supply voltage, and a difference occurring between the time for the power supply voltage to recover and the time intended during circuit design. A semiconductor device containing a circuit as shown in FIG. 8 might therefore malfunction.

In contrast to the above, in the present embodiment, the macro cell internal power supply lines 802, 803 and the sub-power supply line 602 are electrically coupled during the recovery transition period so that a difference in voltage rise speeds between the macro cell internal power supply lines 802 and the sub-power supply line 602 can be suppressed. The present embodiment therefore prevents the input of an intermediate voltage to the input terminal of the macro cell with power supply switch 801, and also prevents the flow of through-current. The embodiment therefore requires no isolation circuit and so can keep the cell delay in the macro cell and the cell surface area to a small value.

Moreover, by utilizing a higher drive power than the drive power in the first circuit block power supply switch 603, for the macro cell power supply switches 804 or 805, the charging of the macro cell is only implemented by way of the first circuit block power supply switch 603 having the smaller drive power, while the macro cell power supply switches 804 and 805 are still in the off state, so that the effect of power supply noise on the main power supply lines 809 and 810 is suppressed.

When the first main power supply line 809 and the second main power supply line 810 have different voltages, the charging/discharging is further performed in the macro cell second core internal power supply line 803 by way of the macro cell second core power supply switch 805 after the macro cell second core power supply switch 805 was set to on. However in most cases the difference in voltage between the first main power supply line 809 and the second main power supply line 810 is usually small so that the effect from power supply noise on the second main power supply line 810 due to this charging/discharging is small.

FIG. 10 is one example of a timing chart corresponding to the circuit diagram in FIG. 8. This drawing shows the retention mode operation for setting only the macro cell first core 806 including RAM memory peripheral circuit section to the power shutdown state, for keeping the macro cell second core 807 containing RAM memory array section at the normal operating state, and for continually retaining data in the memory cell.

When transitioning from the normal operating state to the power supply shutdown state, the macro cell internal inter-power supply switch control signal 813 keeps the macro cell internal inter-power supply switch 808 at the off state, and the macro cell second core power supply switch control signal 812 sets the macro cell second core power supply switch 805 at the on state, and the first circuit block power supply switch control signal 510 and the macro cell first core power supply switch control signal 811 set the first circuit block power supply switch 603 and the macro cell first core power supply switch 804 to the off state. These states therefore cause a voltage drop to occur in the sub-power supply line 602 and the macro cell first core internal power supply line 802 due to the leak current.

At this time, assuming there is no coupling section 104, there is a difference in power supply voltage drop speeds between the macro cell first core internal power supply line 802 and the sub-power supply line 602 as already described using FIG. 4 so that a difference in the voltage potential occurs on both of these power supply lines. Due to the above reason, during the transition period from the normal operation state to the power shutdown state, the macro cell first core 806 might possibly input an intermediate voltage potential into the post-stage circuit cell 103 within the first circuit block 501, so the sudden flow of through-current might cause a difference between the transition time to the power shutdown state and the intended time during the circuit design, or possibly cause power supply noise. Therefore, a semiconductor device containing a circuit as shown in FIG. 8 might possibly malfunction.

In the present embodiment however, the coupling by the coupling section 104 can suppress the difference in voltage drop speeds. Suppressing the difference in voltage drop speeds prevents input of an intermediate voltage to the input terminal of the post-stage circuit cell 103 within the first circuit block, and prevents through-current from flowing.

When recovering from the power shutdown state to the normal operation state, first of all, the first circuit block power supply switch control signal 510 only turns on the first circuit block power supply switch 603, and after the voltage in the sub-power supply line 602 and macro cell first core internal power supply line 802 have risen to a sufficiently high voltage, the macro cell first core power supply switch control signal 811 turns on the macro cell first core power supply switch 804 which lowers the power supply impedance, and transitioning to a normal operation state.

At this time, assuming there is no coupling section 104, and there is a voltage rise in the macro cell first core internal power supply line 802 and the sub-power supply line 602 due to the respective power supply switches, then a difference in (power supply) voltage rise speeds will occur between the macro cell first core internal power supply line 802 and the sub-power supply line 602 as already described in FIG. 4 so that a difference in the voltage potential occurs on both of these power supply lines. When for example in the case of using a high-performance RAM macro cell that requires high-speed operation, and the number of PMOS switches in the macro cell first core power supply switch 804 for suppressing voltage drops during operation is relatively large compared to the first circuit block power supply switch 603, then the voltage in the macro cell first core internal power supply line 802 will rise rapidly compared to the sub-power supply line 602 during the recovery period from the power shutoff state to the normal operation state. Due to this rapid voltage rise, the pre-stage circuit cell 102 within the first circuit block 501 might therefore possibly input an intermediate voltage potential into the macro cell first core 806 including RAM memory peripheral circuit sections during this period where transitioning from the power shutoff state to the normal operating state. This input of an intermediate voltage potential possibly lead to the problems such as an increase in electrical power due to the flow of through-current, the generation of power supply noise, and the difference between the time for the power supply voltage to recover and the intended time during circuit design. Therefore a semiconductor device containing a circuit as shown in FIG. 8 might malfunction.

In the present embodiment however, the macro cell first core internal power supply line 802 and the sub-power supply line 602 are coupled by the coupling section 104 so that the present embodiment can prevent a difference in voltage rise speeds in the sub-power supply line 602 and the macro cell first core internal power supply line 802. The invention can therefore prevent an intermediate voltage potential from being input to the input terminal of the macro cell with power switch 801, and prevent the flow of through-current. The semiconductor device of this embodiment therefore requires no isolation circuit and so can keep the cell delay in the macro cell and the cell surface area to a small value.

Moreover, by utilizing a higher drive power in the macro cell first core power supply switch 804 than the drive power in the first circuit block power supply switch 603, the charging of the macro cell is only implemented by way of the first circuit block power supply switch 603 having the smaller drive power, while the macro cell power supply switch 804 is still in the off state, so that the effect of power supply noise on the main power supply lines 809 and 810 can be suppressed.

As described above, besides coupling the main power supply line 809 or 810 and the macro cell first core power supply switch 804 or 805, there is also a coupling between the macro cell first core internal power supply line 802 and the sub-power supply line 602 in the macro cell with power supply switch 801 of the present embodiment. The power supply terminals are normally defined in the cell library to allow automatic power supply wiring coupling by automated wiring tools, etc. Besides the power supply terminal of macro cell power supply switch coupled to the main power supply line in the macro cell 801 library; the power supply terminal of the macro cell first core internal power supply line 802 for coupling with the sub-power supply line 602 is also defined in another library so that couplings can be made by automatic power supply wiring by utilizing automated wiring tools and so on to make designing the semiconductor device easier.

What is claimed is:

1. A semiconductor device comprising:
a first power supply line;
a second power supply line coupled by way of a first switch to the first power supply line;
a macro cell containing a macro cell core coupled to the second power supply line;
a third power supply line coupled by way of a second switch to the first power line; and
a circuit block coupled to the third power supply line, and coupled to at least either of the input or the output of the macro cell core,
wherein the second power supply line is coupled to the third power supply line.

2. The semiconductor device according to claim 1,
wherein the macro cell is positioned within the circuit block, and
wherein the first power supply line extends within the macro cell and is coupled to the first switch.

3. The semiconductor device according to claim 2,
wherein, the third power supply line extends into the macro cell,
wherein the second power supply line intersects the third power supply line, and
wherein the second power supply line and the third power supply line are coupled together by a via or through-hole coupling structure for coupling the second power supply line and the third power supply line at their cross point.

4. The semiconductor device according to claim 1, comprising:
a control circuit to control the first and the second switches,
wherein the drive power of the first switch is larger than the drive power of the second switch, and
wherein the control circuit sets the first switch and the second switch to the off state, and then sets the first switch to the on state after setting the second switch to the on state.

5. The semiconductor device according to claim 1,
wherein the macro cell core contains a RAM.

6. The semiconductor device according to claim 1,
wherein the macro cell core contains transistors with a lower threshold voltage than the transistors within the circuit block.

* * * * *